(12) United States Patent
Robinson

(10) Patent No.: US 7,042,287 B2
(45) Date of Patent: May 9, 2006

(54) SYSTEM AND METHOD FOR REDUCING DYNAMIC RANGE AND IMPROVING LINEARITY IN AN AMPLICATION SYSTEM

(75) Inventor: Ian Robinson, Venice, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 321 days.

(21) Appl. No.: 10/625,367

(22) Filed: Jul. 23, 2003

(65) Prior Publication Data

US 2005/0017800 A1   Jan. 27, 2005

(51) Int. Cl.
    *H03F 1/26*   (2006.01)

(52) U.S. Cl. .................................... 330/149; 330/129

(58) Field of Classification Search .............. 330/149, 330/129, 136; 375/297; 455/63
See application file for complete search history.

(56) References Cited

U.S. PATENT DOCUMENTS

| | | | |
|---|---|---|---|
| 4,596,043 A | 6/1986 | Leitch | |
| 5,862,452 A | 1/1999 | Cudak et al. | |
| 6,125,103 A | 9/2000 | Bauml et al. | |
| 6,356,606 B1 | 3/2002 | Hahm | |
| 6,392,483 B1 | 5/2002 | Suzuki et al. | |
| 6,449,302 B1 | 9/2002 | Hunton | |
| 6,583,664 B1 * | 6/2003 | Mathe et al. .................. | 330/10 |
| 6,600,369 B1 * | 7/2003 | Mitzlaff ...................... | 330/149 |
| 6,794,936 B1 * | 9/2004 | Hsu et al. .................... | 330/149 |
| 6,798,843 B1 * | 9/2004 | Wright et al. ............... | 375/296 |
| 2002/0101936 A1 | 8/2002 | Wright et al. | |
| 2003/0091123 A1 | 5/2003 | Dartois | |

FOREIGN PATENT DOCUMENTS

EP   1 065 856 A2   1/2001

OTHER PUBLICATIONS

European Search Report for EP 04 017 347.8; issued on Nov. 11, 2004; Completed on Nov. 3, 2004 by Examiner G. Tyberghien.

\* cited by examiner

*Primary Examiner*—Henry Choe
(74) *Attorney, Agent, or Firm*—Tarolli, Sundheim, Covell & Tummino L.L.P.

(57) ABSTRACT

An amplification system and method is provided that reduces peaks associated with an input signal, and provides correction, in one or more spectral bands, to signal distortion and out-of-band emissions that result from the peak reduction. The correction signal that removes signal distortion and OOB emissions associated with the peak reduction can be calculated or electronically derived. The correction signal can be combined with the peak reduced signal prior to or after amplification of the peak reduced input signal.

19 Claims, 8 Drawing Sheets

SYSTEM AND METHOD FOR REDUCING DYNAMIC RANGE AND IMPROVING LINEARITY IN AN AMPLICATION SYSTEM

CROSS REFERENCE TO RELATED APPLICATIONS

The present application is related to New Robinson U.S. Patent Application entitled "Digital Cross Cancellation System", Filed Jul. 23, 2003, assigned to the same assignee as the present application.

TECHNICAL FIELD

The present invention relates generally to electronic devices, and more particularly to a system and method for reducing dynamic range and improving linearity in an amplification system.

BACKGROUND OF THE INVENTION

RF power amplifiers used for wireless communication transmitters, with spectrally efficient modulation formats, require high linearity to preserve modulation accuracy and to limit spectral regrowth. Typically, a linear amplifier, Class-A type, Class-AB type or Class-B is employed to faithfully reproduce input signals and to limit the amplifier output within a strict emissions mask. Linear amplifiers are capable of electrical (DC power in to RF power out or DC-RF) efficiencies 50% or greater when operated at saturation. However, they are generally not operated at high efficiency due to the need to provide high linearity. For constant envelope waveforms, linear amplifiers are often operated below saturation to provide for operation in their linear regime. Time varying envelopes present an additional challenge. The general solution is to amplify the peaks of the waveform near saturation, resulting in the average power of the waveform being amplified at a level well backed-off from saturation. The back-off level, also referred to as output power back-off (OPBO), determines the electrical efficiency of a linear amplifier.

For example, the efficiency of a Class-A type amplifier decreases with output power relative to its peak value (EFF=$P_{OUT}/P_{PEAK}$). The efficiency of Class-B type amplifiers also decreases with output power relative to its peak value (EFF=$(P_{OUT}/P_{PEAK})^{1/2}$). Class-AB type amplifiers have output power variations intermediate between these values. Thus, there is customarily an inherent tradeoff between linearity and efficiency in amplifier designs.

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent channels but produces time-varying envelopes. In addition to amplifying individual waveforms with time varying envelopes, many transmitters (especially in base stations) are being configured to amplify multiple carriers. Multi-carrier signals have a wide distribution of power levels resulting in a large peak-to-average ratio (PAR). Therefore, the operation of the linear amplifiers in these types of signals is very inefficient, since the amplifiers must have their supply voltage sized to handle the large peak voltages even though the signals are much smaller a substantial portion of the time. Additionally, the size and cost of the power amplifier is generally proportional to the required peak output power of the amplifier. Techniques that limit out-of-band (OOB) emissions while the amplifier operates at or near saturation are highly desirable.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and application growing in use. Each requires amplification of a waveform with high PAR levels, above 10 dB in some cases. The sparse amount of spectrum allocated to terrestrial wireless communication requires that transmissions minimize out-of-band (OOB) emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its, peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver both for manufacture and operation.

Many modern digital communications systems transmit complex waveforms consisting of multiple carriers, multiple code channels, or other signals that give rise to large, infrequent peaks in signal power. These signals, while rich in information content, are costly to transmit in terms of hardware and electrical consumption. Any scheme that reduces the size of the peaks without introducing substantial levels of error is desirable. Most modern day communication standards strictly limit the amount of signal distortion and OOB emissions that can occur in a signal transmission. There are a variety of schemes to clip a signal which result in substantial amounts of signal distortion and/or OOB emissions. The strict regulation of OOB emissions is often the limiting factor in the degree to which peak signals can be limited by clipping.

Linearization techniques generally improve wanted signal distortion and reduce OOB emissions. Some linearization techniques, such as digital pre-distortion and versions of digital cross cancellation require a priori information on the mechanisms that cause distortion and OOB emissions. Intentional clipping of a signal results in OOB emissions that can be readily predicted. Most linearization techniques operate over a limited bandwidth but these can be adapted to work in several parallel channels with greater efficacy.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to an amplification system and method that reduces peaks associated with an input signal and provides correction to the reduced peak signal associated with signal distortion and/or OOB emissions that result from the peak reduction. This provides a final amplified output signal substantially free of signal distortion and/or OOB emissions. The correction signal can be combined with the peak reduced signal prior to (e.g., pre-distortion) or after amplification of the peak reduced input signal (e.g., digital cross cancellation). The input signal can be clipped, for example, via a clipping filter to reduced peaks associated with the input signal. The correction signal can be calculated that removes signal distortion and/or OOB emissions associated with the clipped input signal. An anti-peak signal can be combined with the input signal to reduce peaks associated with the input signal. The correction signal that is combined with the peak reduced input signal after final amplification is one that appropriately cancels the "anti-peak" signal. The anti-peak signal can be combined with the input signal prior to or after digital-to-analog conversion of the input signal.

In one aspect of the invention, the peak reduced input signal is separated into a plurality of sub-bands by a channelizer. Each sub-band is provided with an associated modification component that can modify at least one of gain, phase and offset of the sub-band signal to mitigate signal distortion and OOB emissions associated with one or more sub-bands prior to final amplification. The plurality of sub-bands can then be aggregated to provide an aggregated signal. The aggregation can occur prior to or after digital-to-analog conversion. This technique can be employed alone as an improved (e.g., wider bandwidth) pre-distortion technique, as a pre-distortion component with the correction signal amplification system or as part of the correction signal amplification system.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to an amplification system and method that reduces distortion and/or OOB emissions in amplifier systems such as those resulting from the clipping of peaks associated with an input signal. The system and method provide one or more corrections to the reduced peak signal associated with signal distortion and OOB emissions that result from the peak reduction. Therefore, smaller (less power capacity) and less costly power amplifiers can be employed to achieve similar performance. A second result is improved amplifier system efficiency as compared to amplifier systems with much larger less efficient power amplifiers. The present invention can be employed in wireless standards such as WCDMA, OFDM, multi-carrier versions of GSM and CDMA 2000 and other wireless standards and applications.

Figure 1:
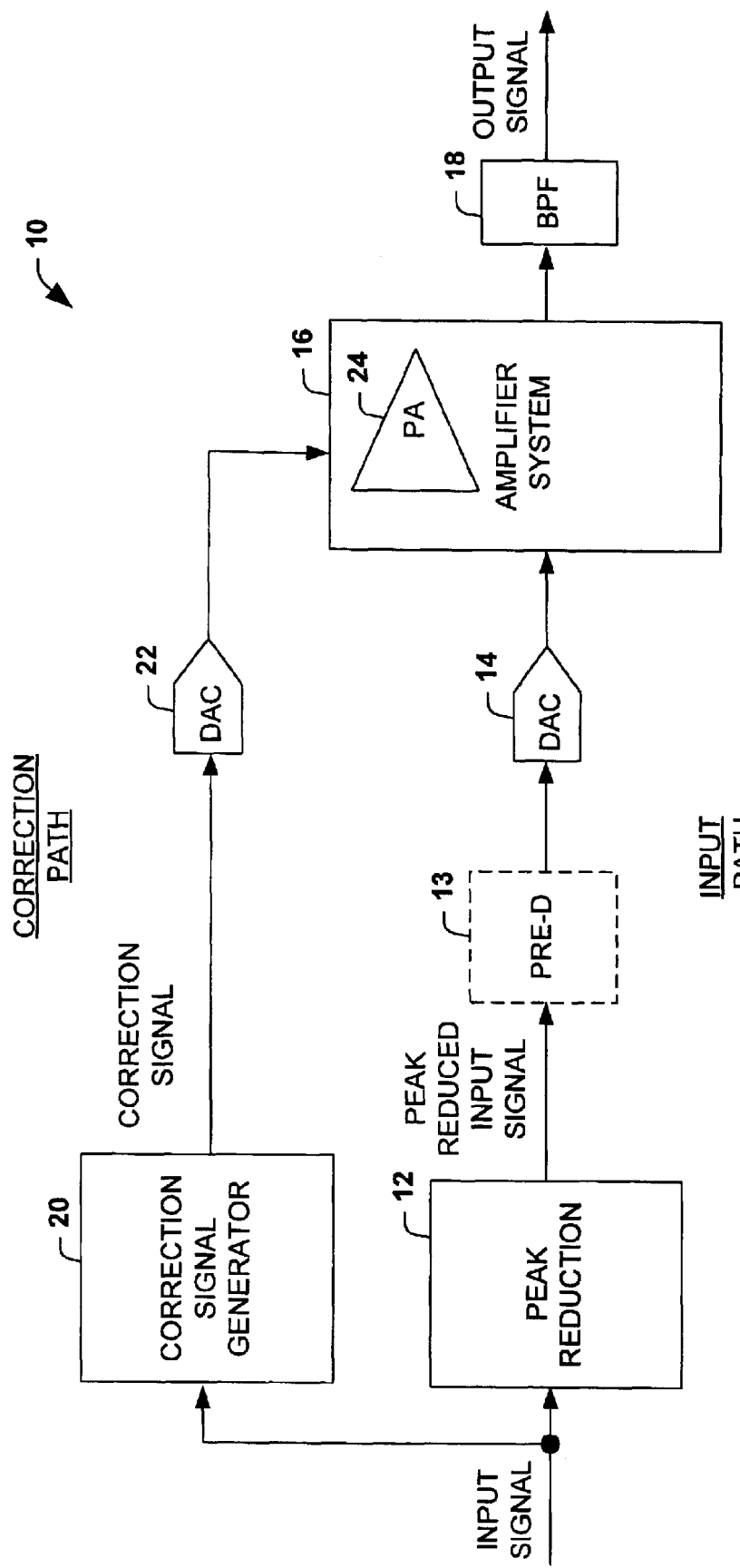
FIG. 1 illustrates a schematic block diagram of an amplification system in accordance with an aspect of the present invention.

FIG. 1 illustrates an amplification system 10 in accordance with an aspect of the present invention. The amplification system 10 includes a peak reduction component 12 that receives an input signal and generates a peak reduced input signal. The peak reduction component can clip peaks from the input signal by employing a clipping filter or the like to remove large peaks from the input signal. Alternatively, the peak reduction component 12 can be a peak reduction shaping algorithm. Furthermore, the peak reduction component can add signals (e.g., anti-peaking signals, anti-distortion signals) to the input signal to reduce peaks and distortions associated with the input signal. The peak reduction component can also perform pre-distortion on the peak reduced signal to mitigate errors to signal amplitude or phase and OOB emissions caused by the peak reduction. The above modifications can be performed individually, in combination or with other modification techniques to produce a peak reduced input signal that is optimal with respect to amplifier linearity, efficiency and power consumption. The choice of clipping option depends on the balance of allowable distortion in the wanted signal (e.g., error vector magnitude, EVM) with constraints for OOB emissions. The OOB emissions that limit many clipping schemes, and to some extent, the distortion of the wanted signals, are cancelled by a dedicated subsystem before the signal is transmitted.

The peak reduced input signal is transmitted to a digital-to-analog converter (DAC) 14. The DAC 14 converts the peak reduced input signal from the digital domain to the analog domain. The DAC can be a delta sigma modulated DAC (e.g., 1-bit DAC) to perform a digital-to-analog conversion directly to radio transmission frequencies. A one-bit converter provides analog conversion with extremely high linearity (low distortion). Prior to digital-to analog conversion, the peak reduced input signal can be provided to a pre-distortion component 13 to remove at least a portion of the signal distortion and/or OOB emissions caused by the peak reduction. Employing pre-distortion reduces the remaining distortion so that components that are smaller, less costly and consume less power can be employed. The output of the DAC 14 is then provided to an amplifier system 16.

The amplifier system 16 includes a power amplifier 24 for amplification of the peak reduced input signal. The power amplifier 24 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions. The limit for WCDMA and many other wireless systems is the strict emissions mask in adjacent and nearby spectral channels which limits the amount of OOB that can be transmitted. The present invention illustrated in FIG. 1 is estimated to be able to correct 20–40 dB of OOB emissions. Thus, the OOB induced by clipping the wanted signal should be corrected by an amount to assure the OOB meets the emission mask of the relevant standard.

For most amplifiers, there is roughly a dB for dB savings in size and cost of the selected amplifier with the peak-to-average ratio (PAR) reduction of the amplification system. Therefore, the present invention allows for employment of a power amplifier that is smaller (less power). Efficiency of linear amplifiers (class A, A/B, B) which are prevalent in wireless systems is normally proportional to the PAR (class A degrades in efficiency about dB for dB of PAR, class B one-half dB per dB, and class A/B in-between), and thus the overall efficiency can be significantly improved with peak reduction. A class A/B amplifier transmitting a 10-dB PAR signal has total efficiency below 10% because most of the signals are extremely backed-off. The same transmitter can be made with double the efficiency at about 5 dB PAR employing the present invention. The low frequency of occurrence of the peaks enables the present invention to aggressively clip peaks without significant degradation of EVM. There can be dramatic degradation of OOB emissions resulting from clipping, which the present invention corrects prior to final transmission. The increase in efficiency is critical in sizing the power handling, backup battery, and cooling equipment at a base station. The cost savings for these related systems can be comparable to the price of the transmitter.

A correction signal generator 20 provides a correction signal to correct for signal distortion and OOB emissions caused by the peak reduction of the input signal. The signal distortion and OOB emissions can be mathematically computed based on the peak reduction that is performed. Therefore, a desired correction signal can be computed in real-time or off-line and programmed into the correction signal generator 20 (e.g., via a look-up table, a mathematical algorithm). The correction signal is transmitted to a second DAC 22. The second DAC 22 can also be a delta sigma modulated DAC to perform a digital-to-analog conversion directly to radio transmission frequencies of the correction signal.

The analog correction signal is then provided to the amplifier system 16. The analog correction signal can be combined with the peak reduced input signal to mitigate signal distortion and OOB emissions prior to amplification by the power amplifier. Alternatively, the analog correction signal can be amplified and combined with the peak reduced input signal after amplification to mitigate signal distortion and OOB emissions in addition to distortions associated with amplification by the power amplifier. The output of the amplifier system 16 is then provided to an optional band pass filter 18, which filters out any remaining unwanted signals outside the desired transmission band to provide a final output signal substantially free of signal distortion and OOB emissions.

In one aspect of the invention, one or both of the first DAC 14 and the second DAC 22 are delta sigma modulated DACs. Delta Sigma modulation is a technique used to generate a coarse estimate of a signal using a small number of quantization levels and a very high sampling rate. The small number (two for a one-bit quantizer) of signal levels introduces "quantization" noise into the system. The effect of oversampling and the use of an integrator feedback-loop in delta-sigma modulation are effective in shifting noise to out-of-band frequencies. The noise shifting properties and introduction of quantization error enables efficient use of subsequent filtering stages to remove noise and produce a more precise representation of the input at a much higher frequency. The delta sigma DACs can be employed to upconvert the input signal directly to radio transmission frequencies, such that further frequency conversion of the signals via conventional analog mixers is not required. The radio transmission frequencies can be in radio frequency (RF) ranges (e.g., megahertz range) or in microwave frequency ranges (e.g., gigahertz range).

The correction signal can also be used purely for linearization in the absence of clipping or peak reduction. This may be desirable as DAC limitations in dynamic range over wide bandwidths can limit digital linearization techniques. The present invention separates the paths of wanted signal and correction signal allowing bandwidth and dynamic range requirements to be allocated over two or more DACs.

Figure 2:
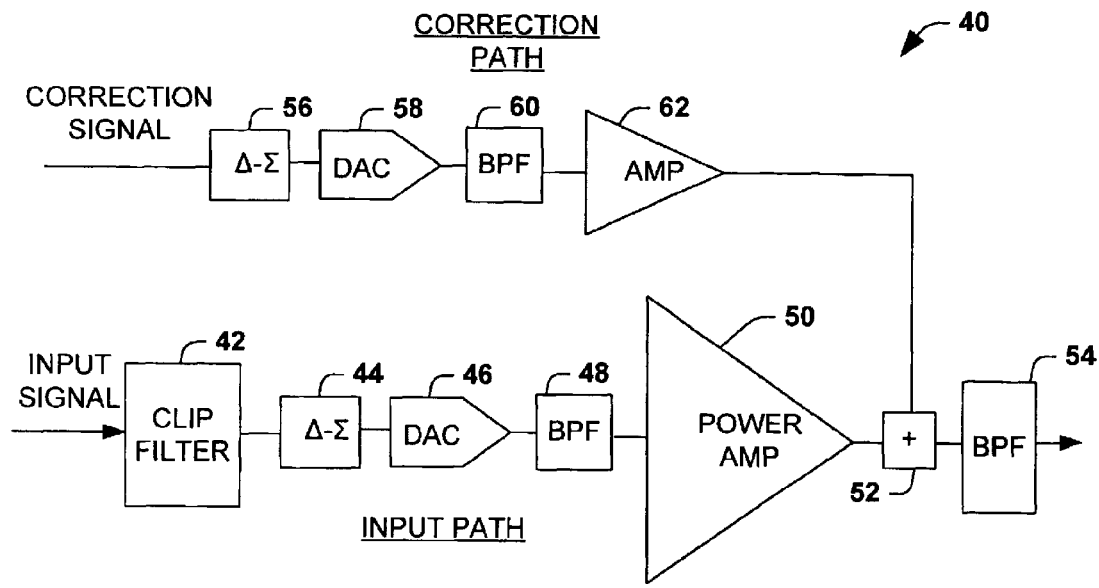
FIG. 2 illustrates a schematic block diagram of an amplification system that combines a correction signal with an amplified peaked reduced input signal in accordance with an aspect of the present invention.

FIG. 2 illustrates an amplification system 40 that employs a version of digital cross cancellation, combining a correction signal with an amplified peaked reduced input signal in accordance with an aspect of the present invention. The amplification system 40 includes a clip filter 42 that performs a clipping process on an input signal. The clipping process reduces the peaks of the input signal to reduce the peak-to-average ratio of the input signal provided to a power amplifier 50. This allows the power amplifier 50 to output a large average power associated with amplification of the peak reduced input signal. The clipping process can be a soft or hard clipping process. Additionally, the clipping filter 42 can perform a fixed or shape limiting algorithm to reduced the peaks and PAR associated with the input signal. The clipping process results in unwanted OOB emissions, spectral distortions, spectral splatter and spectrum spreading. The unwanted characteristics associated with clipping need to be mitigated to conform to most wireless communication standards (e.g., WCDMA, OFDM, GSM).

A digital component (not shown) such as a digital signal processor, provides the input signal, a control signal for controlling the clipping associated with the clipping filter and a correction signal to correct or mitigate OOB emissions caused by the clipping. The clipping filter 42 provides a clipped input signal to a delta sigma modulator 44 along an input path. The delta-sigma modulator 44 is coupled to a DAC 46 that is coupled to a band pass filter 48. The delta-sigma modulator 44, the DAC 46 and the band pass filter 48 cooperate to perform a digital-to-analog conversion directly to radio transmission frequencies. The DAC 46 can be a multi-bit converter or a one-bit converter that provides analog conversion with extremely high linearity (low distortion). The output of the band pass filter 48 is then provided to the input terminal of the power amplifier 50 for amplification. The power amplifier 50 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions. Additional frequency conversion components can be employed as needed.

The digital component (not shown) provides the correction signal along a correction path to a delta sigma modulator 56. The delta-sigma modulator 56 is coupled to a DAC 58, which is coupled to a band pass filter 60. The correction signal can be of substantially lower power compared to the wanted signal (e.g., typically 10–30 dB below the wanted signal level, prior to amplification by the power amplifier). The lower power level of the correction signal allows DAC 58 to be a lower dynamic range DAC than DAC 46. It can also have a wider bandwidth than DAC 46. The delta-sigma modulator 56, the DAC 58 and the band pass filter 60 cooperate to perform a digital-to-analog conversion directly to radio transmission frequencies. The DAC 58 can be a multi-bit converter or a one-bit converter that provides analog conversion with extremely high linearity (low distortion). The correction signal can contain terms to substantially eliminate OOB emission resulting from clipping and OOB emissions resulting from the nominal amplification of the clipped signal. The output of the band pass filter 60 is then provided to the input terminal of a correction amplifier 62 for amplification. The correction amplifier 62 should be substantially linear to provide an accurate analog correction signal to cancel signal distortion and OOB emissions. The corrections signal will normally be 10–30 dB lower power than the wanted signal and does not require a large amplifier. Additional frequency conversion components can be employed as needed.

For example, a class A, A/B amplifier that is well backed-off can be employed. The linearization of the cancellation amplifier 62 could be a pre-distortion system (analog or digital; the latter requiring digitizing and re-converting the signal), a feedforward loop or some other linearization technique. The size of the cancellation amplifier 62 is dependent on the required correction level (i.e., OOB emissions, signal distortions). Therefore, pre-distortion can be employed with the amplification system 40 to reduce the size of the correction amplifier 62.

The correction amplifier 62 provides an amplified analog correction signal that can be combined with an analog output signal of the power amplifier 50 to mitigate OOB emissions and signal distortion of the analog output signal as a result of the clipping by the clipping filter 42. The analog correction signal of the cancellation amplifier 62 and the analog output signal of the power amplifier 50 are combined at a summer or coupler 52. It may be necessary to include either digital or analog delay components to synchronize the correction signal and output signal based on a particular implementation. The output of the summer 52 is then provided to an optional band pass filter 54, which filters out any remaining unwanted signals outside the desired transmission band.

Figure 3:
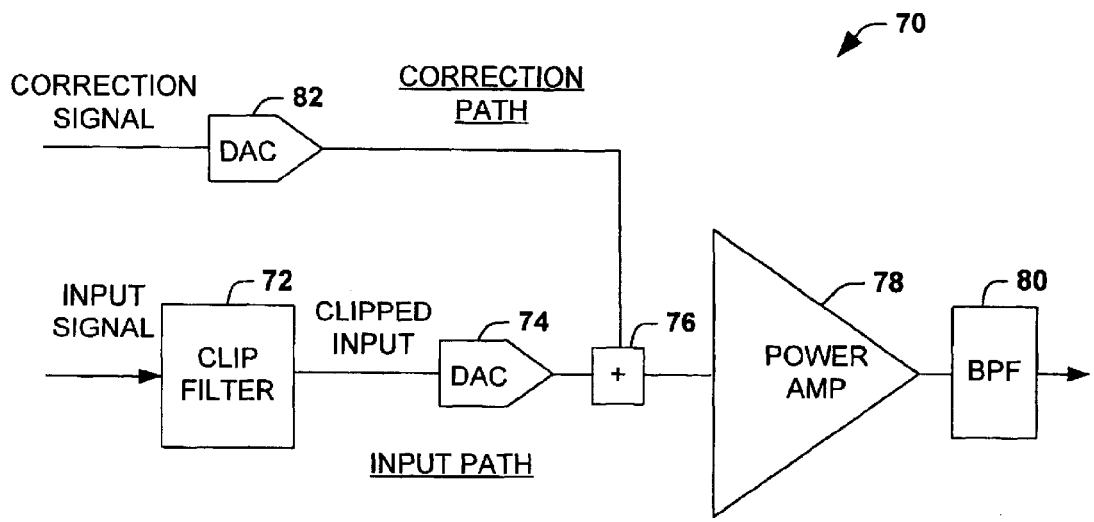
FIG. 3 illustrates a schematic block diagram of an amplification system that combines a correction signal with a peaked reduced or clipped input signal prior to amplification in accordance with an aspect of the present invention.

FIG. 3 illustrates an amplification system that combines a correction signal with a peaked reduced or clipped input signal prior to amplification in accordance with an aspect of the present invention. The amplification system 70 includes a clip filter 72 that performs a clipping process on an input signal. The clip filter 72 can be similar to the clip filter described in FIG. 2. The clipping process reduces the peaks of the input signal to reduce the PAR of the input signal provided to a power amplifier 78. This allows the power amplifier 78 to output a large average power associated with amplification of the clipped input signal. The clipping process can be performed via soft clipping, hard clipping, and/or a fixed or shape limiting algorithm to reduced the peaks and PAR associated with the input signal. The clipping process can result in unwanted OOB emissions, spectral distortions, spectral splatter and spectrum spreading.

A digital component (not shown) such as a digital signal processor, provides the input signal, a control signal for controlling the clipping associated with the clipping filter and a correction signal to correct or mitigate OOB emissions caused by the clipping. The clipping filter 72 provides the clipped input signal to a DAC 74 (e.g., delta sigma modulated DAC) along an input path. The DAC 74 performs a digital-to-analog conversion of the clipped input signal, which can be converted directly to radio transmission frequencies, to produce an analog clipped input signal. The DAC 74 can be a multi-bit converter or a one-bit converter. The output of the DAC 74 is then provided to a summer or coupler 76.

The digital component (not shown) provides the correction signal to a DAC 82 along a correction path, which converts the correction signal from the digital domain to the analog domain to produce an analog correction signal. The DAC 82 can be a multi-bit converter or a one-bit converter. The output of the DAC 82 is also provided to the summer or coupler 76, which combines the analog clipped input signal with the analog correction signal. The correction signal can be of substantially lower power compared to the wanted signal (e.g., typically 10–30 dB below the wanted signal level (prior to amplification by the power amplifier)). The DAC 82 can be wider band and lower dynamic range than DAC 74. The analog correction signal mitigates OOB emissions and signal distortion without the need for employing a cancellation amplifier. The output of the summer 76 is provided to the input of the power amplifier 78 for amplification. The output of the amplifier 78 is then provided to an optional band pass filter 80, which filters out any remaining unwanted signals outside the desired transmission band.

In another aspect of the present invention, at least one of the wanted signal, adjacent channels, and nearby spectral bands are decomposed into small frequency slices or sub-bands, each of which is modified in amplitude and phase and given an offset. When these modified signals are digitized and amplified they cancel the OOB emissions resulting from the clipping. These modified slices are either aggregated before of after the digital-to-analog converter (DAC) operation, depending on the available DAC bandwidth, and amplified to final power levels. This technique can be applied to linearize the entire transmitter chain over wide bandwidths if distortions are predictable. This aspect of the present invention allows the correction terms to tailored to that portion of the spectrum and avoids the problem of digital pre-distortion where a single DAC supplies the bandwidth for the correction terms and dynamic range for the wanted signal and emission mask. An optional feedback loop digitizes and channelizes a sample of the output to enable adaptive improvement of the gain and phase modifications.

Figure 4:
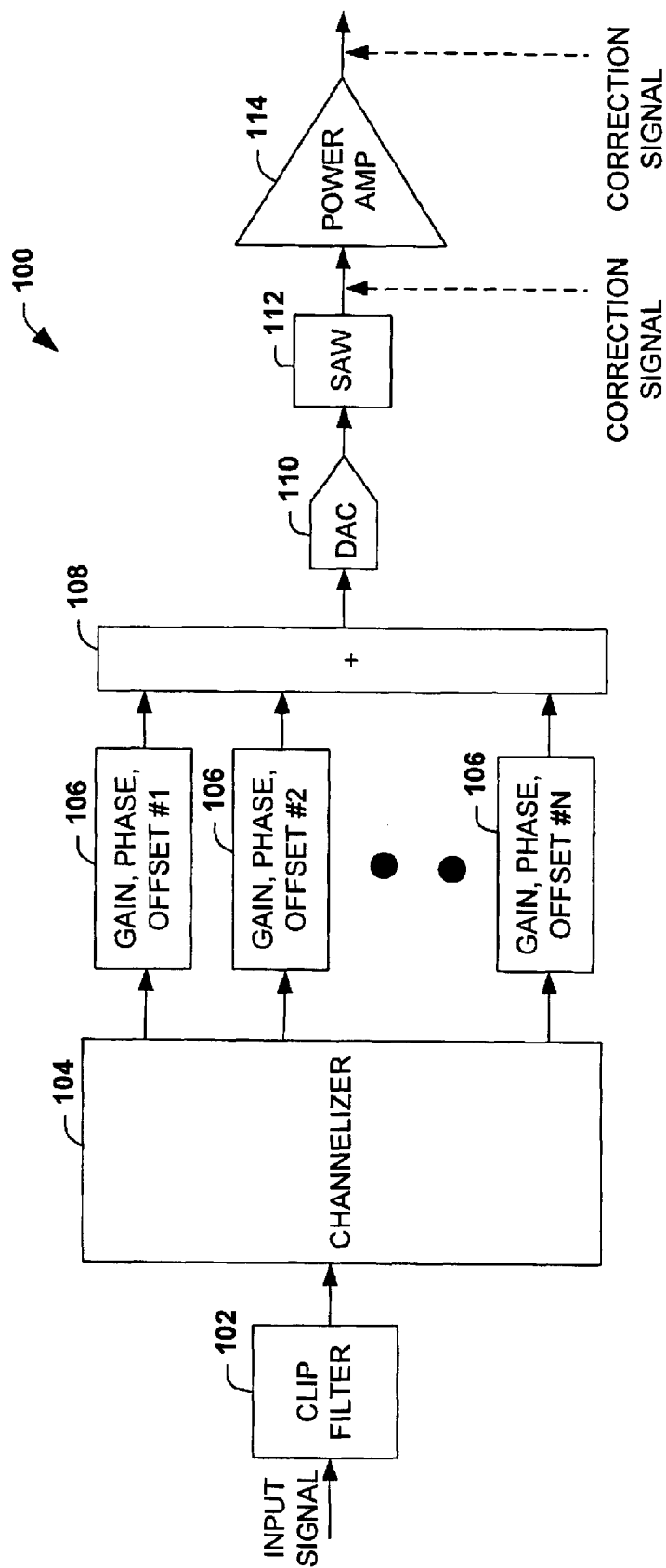
FIG. 4 illustrates a schematic block diagram of an amplification system that separates an input signal into a plurality of transmission sub-bands in accordance with an aspect of the present invention.

FIG. 4 illustrates an amplification system 100 that separates an input signal into a plurality of transmission sub-bands in accordance with an aspect of the present invention. The amplification system 100 includes an optional clip filter 102 that removes peaks associated with an input signal and provides a clipped input signal to a channelizer 104. The channelizer 104 separates the clipped input signal, adjacent spectral channels, and nearby spectral bands into a plurality of sub-bands that can be modified separately to remove OOB emissions and signal distortions associated with each sub-band. A modification component 106 is associated with each sub-band. The associated modification component 106 modifies the gain and phase of the associated sub-band to remove distortions caused by the clipping of the input signal. Optionally, an offset signal is added to each sub-band. The signal modifications are computed to cancel the OOB emissions and signal distortion that will be present after final amplification. This amplification system will provide optimized linearization and/or OOB emission reduction over each portion of the spectrum. The optimized linearization will occur if the clip filter 102 is removed.

A summer 108 recombines the sub-bands into an aggregated or recombined input signal. Alternatively, the sub-bands can be combined later in the signal chain (e.g., after digital-to-analog conversion). Optimizing later in the signal chain requires additional DACs but allows each DAC to be optimized for bandwidth, dynamic range, and other performance parameters. The aggregated input signal is provided to a DAC 110 that converts the aggregated input signal from a digital signal to an analog aggregated input signal. The analog aggregated input signal is then provided to an optional surface acoustic wave (SAW) filter 112. The analog aggregated signal is then provided to a power amplifier 114 for final amplification. An optional ADC and digital channelizer can be provided to digitize a sample of the output and compare the sample of the output to the wanted signals to adaptively improve the gain, phase, and offset terms for each sub-band. Corrections signals can be provided to the signal prior to amplification and/or after amplification to facilitate cancellation of signal distortion and OOB emissions.

The channelizer 104, the modification components 106 and the aggregation component 108 can be employed as a pre-distortion component for a variety of different amplification systems. Additionally, the channelizer 104, the modification components 106 and the aggregation component 108 can be employed as a pre-distortion component in an amplification system such as that illustrated in FIG. 1. Furthermore, the modification component 106 can provide the desired correction signals to the individual sub-bands in the form of or in addition to the gain, phase and offset adjustments.

In another aspect of the present invention, an additional signal that is designed to cancel the peaks of the wanted signals is added to the wanted signals. This signal can be filtered or cancelled prior to transmission so as not to cause errors to the intended receiver or other receivers in the area. In some cases (e.g., standards based on CDMA) the added signal is in the transmission band of the wanted signal but is orthogonal. The additional signal(s) may be added prior to and/or after digital-to-analog conversion occurs.

Figure 5:
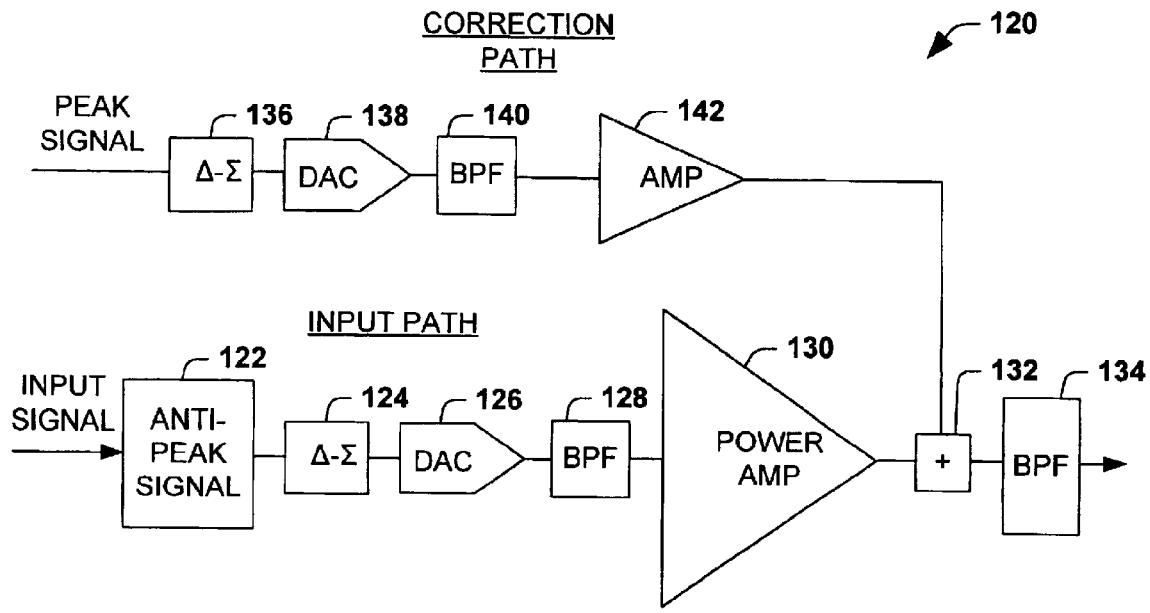
FIG. 5 illustrates a schematic block diagram of an amplification system that combines a digital anti-peak signal with a digital input signal in accordance with an aspect of the present invention.

FIG. 5 illustrates an amplification system 120 that combines a digital anti-peak signal with a digital input signal in accordance with an aspect of the present invention. The amplification system 120 includes an anti-peak signal component 122 that combines an anti-peak signal with an input signal to reduce peaks associated with an input signal, and to mitigate signal distortion and OOB emissions associated with either the reduction of the peaks or non-linearities in the signal chain. The combining of the input signal with the anti-peak signal reduces the peaks of the input signal and the PAR of the input signal provided to a power amplifier 130.

The peak reduced input signal is transmitted to a delta sigma modulator 124 along an input path. The delta-sigma modulator 124 is coupled to a DAC 126, which is coupled to a band pass filter 128. The delta-sigma modulator 124, the DAC 126 and the band pass filter 128 cooperate to perform a digital-to-analog conversion directly to radio transmission frequencies. The DAC 126 can be a multi-bit converter or a one-bit converter that provides analog conversion with extremely high linearity (low distortion). The output of the band pass filter 128 is then provided to the input terminal of the power amplifier 130 for amplification to provide an amplified peak reduced output signal. The power amplifier 130 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions.

A peak signal is provided to a delta sigma modulator 136 along a correction path. The peak signal is a substantial inversion of the anti-peak signal and removes the anti-peak signal from the final amplified output. However, if the anti-peak signal can be removed via filtering, for example, by employing an orthogonal signal or output of band signal with the peak reduced input signal, and the signal losses are acceptable, addition of the peak signal may not be desired. The peak signal may also contain terms to reduce OOB emissions and/or reduce wanted signal distortion.

The delta-sigma modulator 136 is coupled to a DAC 138, which is coupled to a band pass filter 140. The delta-sigma modulator 136, the DAC 138 and the band pass filter 140 cooperate to perform a digital-to-analog conversion directly to radio transmission frequencies. The DAC 138 can be a multi-bit converter or a one-bit converter. The output of the band pass filter 140 is then provided to the input terminal of a peak amplifier 142 for amplification. The peak amplifier 142 provides the amplified peak signal to a summer or coupler 132 to be aggregated with the output signal from the power amplifier 130 to remove the anti-peak signal from the final output. The output of the summer 132 is then provided to an optional band pass filter 134, which filters out any remaining unwanted signals outside the desired transmission band. It may be necessary to utilize digital or analog delay elements to synchronize the peak signal and output signal based on a particular implementation.

Figure 6:
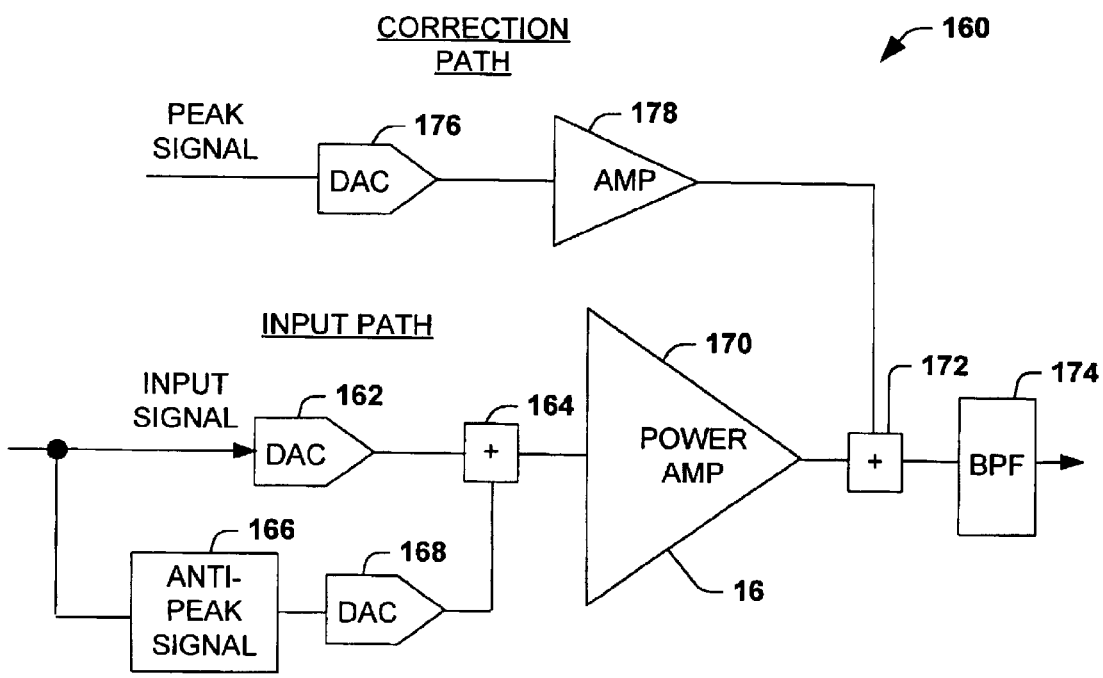
FIG. 6 illustrates a schematic block diagram of an amplification system that combines an analog anti-peak signal with an analog input signal in accordance with an aspect of the present invention.

FIG. 6 illustrates an amplification system that combines an anti-peak signal with an input signal prior to amplification in accordance with an aspect of the present invention. This variant of the present invention can be used to introduce an out-of-band anti-peaking signal that would otherwise be filtered prior to final amplification. The anti-peaking signal is designed not to result in appreciable OOB emissions from its interaction with the wanted signal. The amplification system 160 includes an anti-peak signal component 166 that generates an anti-peak signal based on an input signal. The input signal is provided to a first DAC 162, which converts the input signal from the digital domain to the analog domain to provide an analog input signal. The anti-peak signal is provided to a second DAC 168, which converts the anti-peak signal from the digital domain to the analog domain to provide an analog anti-peak signal. The analog anti-peak signal and the analog input signal are then combined at an analog summer or coupler 164. The combining of the anti-peak signal with the input signal reduces the PAR of the input signal provided to the power amplifier 170. This allows the power amplifier 170 to output a large average power associated with amplification of the peak reduced input signal.

A peak signal is provided to a third DAC 176. The peak signal is a substantial inversion of the anti-peak signal and removes the anti-peak signal before final transmission. The third DAC 176 performs a digital-to-analog conversion directly to radio transmission frequencies. The third DAC 176 can be a multi-bit converter or a one-bit converter. The output of the third DAC 176 is then provided to the input terminal of a peak amplifier 178 for amplification. The peak amplifier 178 provides an amplified peak signal to a summer or coupler 172 to be aggregated with an analog output signal from the power amplifier 170. The amplified peak signal removes the anti-peak signal from the final output of the amplification system 160. The combined output of the summer 172 is then provided to an optional band pass filter 174, which filters out any remaining unwanted signals outside the desired transmission band.

In one aspect of the invention, the added anti-peak signal can be a code channel that is orthogonal to the wanted signal. It can be in part or in whole in a separate band from the wanted signals. It may be advantageous to be outside of the passband of the first bandpass or of the final filter so that these filters prevent transmission. If it is in the transmission band, the present invention can cancel it after the final amplifier but before transmission by a signal sent along the signal correction path. If the anti-peaking signal is filtered by a bandpass signal, it saves dynamic range for the DAC.

Figure 7:
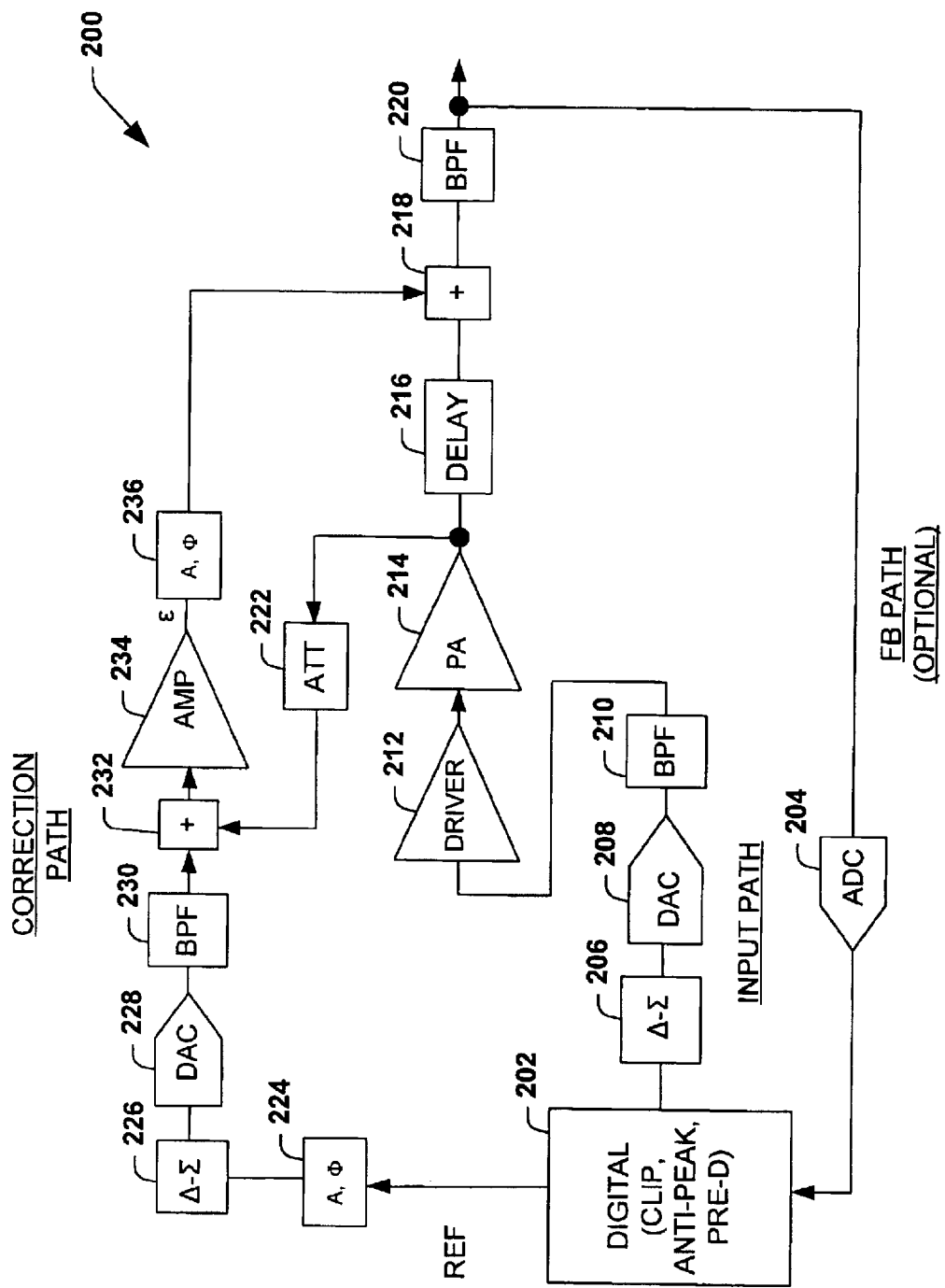
FIG. 7 illustrates a schematic block diagram of an amplification system that employs a digital cross-cancellation technique in accordance with an aspect of the present invention.

FIG. 7 illustrates an amplifier system 200 that employs a second variant of digital cross-cancellation technique in accordance with an aspect of the present invention. The amplification system 200 includes a digital component 202 that receives an input signal and performs a peak reduction of the input signal. The input signal can be in a variety of different signal formats. For example, the signal can be a signal that conforms to WCDMA, multi-carrier GSM, OFDM or other signals having signatures with high peak-to-average (PAR) ratios.

The digital component 202 can add or remove signals to the input signal to improve the performance of the amplification system 200. For example, the digital component 202 can remove peaks associated with input signal, for example, by clipping and/or adding anti-peak signals to the input signal. Additionally, the digital component 202 can perform pre-distortion of the composite input signal. Alternatively, pre-distortion can be performed after peak removal or before and/or after other distortion mitigating techniques. The digital component 202 also generates a digital reference signal (REF) associated with the desired output prior to any modification of the input signal. It is to be appreciated that the digital reference signal can be a representation of the desired output signal or an inverted representation of the desired output signal.

The peak reduced input signal is transmitted to a delta-sigma modulator 206 along an input path. The delta sigma modulator 206 is coupled to a DAC 208 (e.g., 1-bit DAC, multi-bit DAC), which is coupled to a band pass filter 210. The delta-sigma modulator 206, the DAC 208 and the band pass filter 210 cooperate to perform a digital-to-analog conversion directly to radio transmission frequencies. The output of the band pass filter 210 is then provided to an optional driver amp 212, which provides additional gain to the analog input signal. The output of the driver 212 is then provided to the input terminal of the power amplifier 214 for amplification. The power amplifier 214 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions.

The digital component 202 provides a reference signal along a correction path to a digital phase inverter 224. The reference signal is a reference version (REF) of the input signal corresponding to the desired amplified output signal prior to any modifications. Alternatively, the digital inverter 224 can be eliminated and the inverted version of the clean reference signal can be provided by the digital component 202. The inverted reference signal is transmitted to a delta-sigma modulator 226. The delta sigma modulator 226 is coupled to a DAC 228 (e.g., 1-bit DAC, multi-bit DAC) and a band pass filter 230. The delta-sigma modulator 226, the DAC 228 and the band pass filter 230 cooperate to perform a digital-to-analog conversion directly to radio transmission frequencies of the inverted version of the clean reference signal (REF).

A small portion of the power amplifier output is split off through an attenuator 222 and summed with the inverted clean reference signal through a summer or coupler 232. The output of the summer 232 is signal distortion and OOB emissions, including the results of clipping. The output of the summer 232 is amplified by an error amplifier 234 to produce an error signal (ε). The error signal is inverted through a phase inverter 236 to provide an inverted error signal. The inverted error signal is aggregated with a delayed version of the output of the power amplifier 214 via a delay component 216 through a summer or coupler 218 to remove OOB emissions and reduce distortion levels. The output of the summer 218 is then provided to an optional band pass filter 220 that filters out any remaining unwanted signals outside the desired transmission band. Additional frequency conversion components can be utilized in either signal chain, as needed.

The digital cross-cancellation technique in accordance with an aspect of the present invention can supply correction for amplifier and other non-linearities and it can correct spectral splatter that occurs from intentional clipping of the wanted signals performed to allow for amplifier size reduction. Additionally, since a digital reference signal is employed to determine the desired correction at the output, any modification of the signal can be corrected at the final output stage without the need for additional correction information during the amplification process.

Optionally, a feedback loop through a feedback (FB) path can be provided to sample the output of the bandpass filter 220 of the combined signals, down convert (if needed), and digitize (e.g., with a wideband ADC 204) to examine the entire output transmission band. This optional feedback loop can be employed in the amplification systems illustrated in FIGS. 1–6. The present invention can be employed in other amplifier types such as an envelope elimination and restoration (EER), envelope tracking amplifier, Doherty amplifier or a Linear Amplification with Nonlinear Components (LINC) amplifier.

It is to be appreciated that the various aspects of the invention illustrated in FIGS. 1–7 can be employed alone or in a variety of different combinations. Additionally, the amplification system of the present invention can be employed in a number of applications and/or standards. For example, the amplification system can be employed in wireless transmitter applications for base stations (e.g., satellites, cellular), handsets, and other mobile communication devices.

Figure 8:
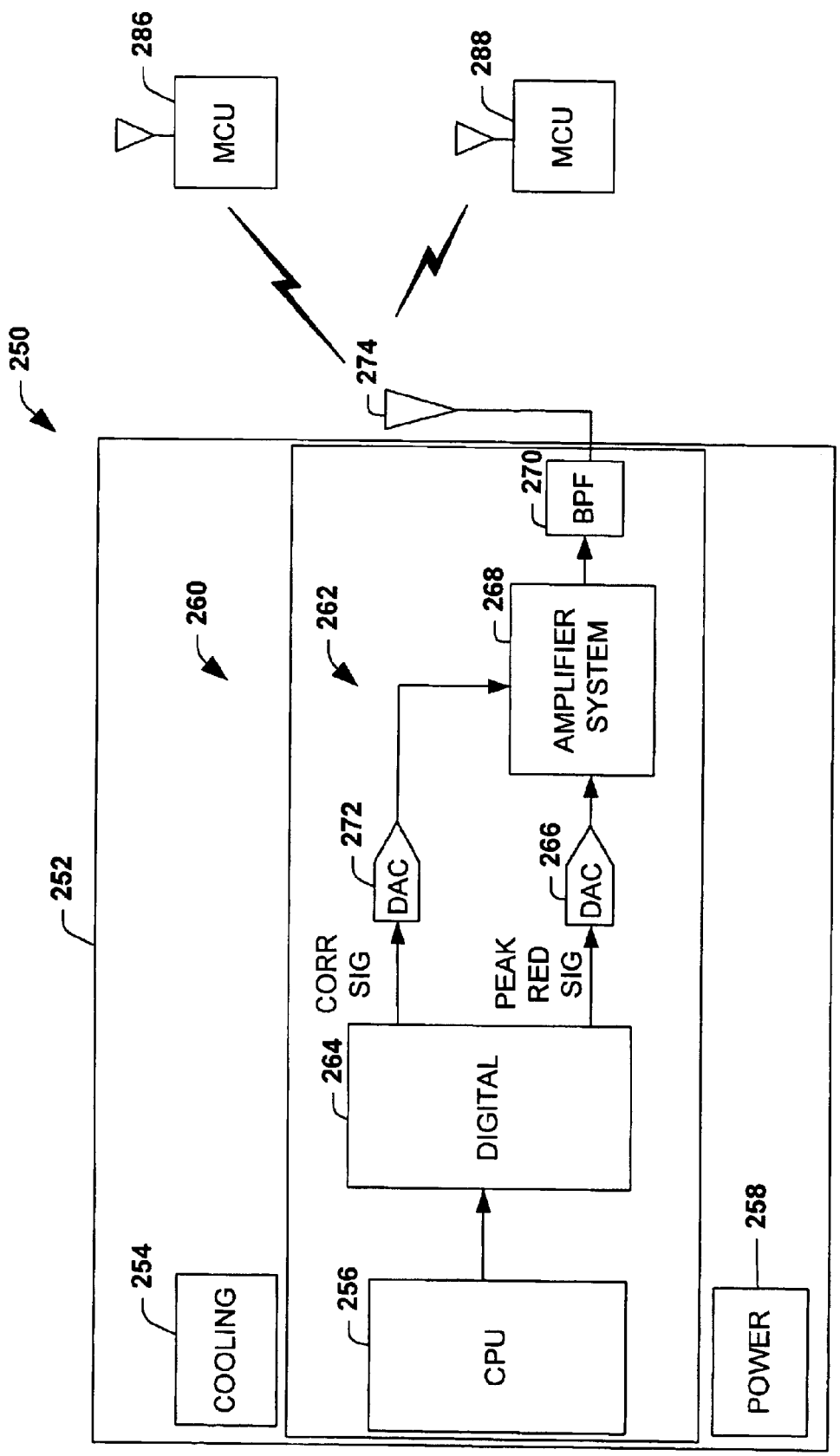
FIG. 8 illustrates a block diagram of a communication system in accordance with an aspect of the present invention.

FIG. 8 illustrates a communication system 250 having a base station 252 with a transmitter 260 employing an amplification system 262 in accordance with an aspect of the present invention. The base station 252 employs a central processing unit (CPU) 256 to operate the base station 252 and provide an input signal to the amplification system 262. For example, the CPU 256 can generate the type of signal (e.g., WCDMA, GSM, OFDM) to be transmitted. The base station 252 communicates to a group of mobile communication unit (MCUs) comprised of MCUs 286 and 288. The MCUs 286 and 288 are for illustrative purposes and it should be appreciated that the group of MCUs can include a greater number of MCUs based on the number of carriers in the output signal.

The base station 252 also includes cooling devices 254 and power devices 258. The power devices 258 can include AC-DC conversion and battery backup devices that protect the base station 252 from power loss failures. The power devices 258 and cooling devices 254 can be substantially reduced in size and cost compared to conventional devices since the amplification system 262 of the present invention operates with substantially more efficiency than conventional amplifier systems. Although the base station 252 is illustrated as having a single transmitter 260, the base station 252 can have a plurality of transmitters communicating to different respective groups of MCUs over similar communication signal standards or different communication signal standards. Additionally, the MCUs 286 and 288 can also include transmitters with amplifier systems in accordance with the present invention.

The amplification system 262 includes a digital component 264 that receives an input signal from the CPU 256 and generates a peak reduces input signal to a first DAC 266, and a correction signal to a second DAC 272. The peak reduced input signal is converted from the digital to analog domain and provided to an amplifier system 268. The correction signal is also converted from the digital to analog domain and provided to the amplifier system 268. The correction signal mitigates signal distortion and OOB emissions caused by the peak reduction of the input signal. The peak reduction and correction can be performed via one or more techniques as illustrated in the amplification systems of FIGS. 1–7. The output of the amplifier system 268 is then provided to an optional band pass filter 270 that filters out any remaining unwanted signals outside the desired transmission band. The output of the band pass filter is then transmitted across a communication link via an antenna 274.

The present invention enables many transmitter architectures to operate with higher efficiency and substantially smaller part size and cost. A conventional four-carrier WCDMA system can save 50% or more on the most costly part of the transmitter, the final amplifier device. It can also improve its operating efficiency from less than 10% to greater than 20% or more, enabling a significant cost savings in base station capital equipment.

Figure 9:
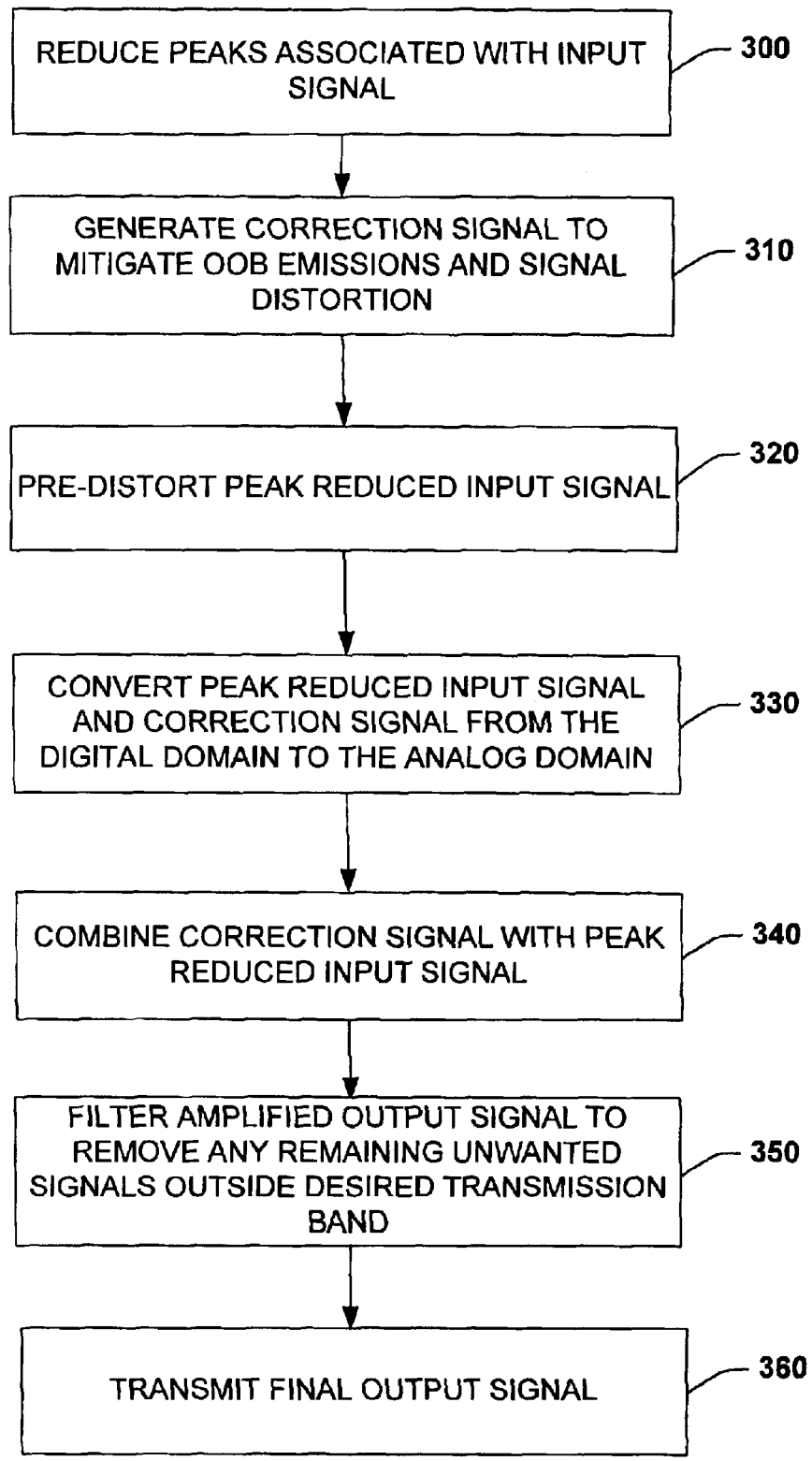
FIG. 9 illustrates a methodology for amplifying an input signal in accordance with an aspect of the present invention.
Figure 10:
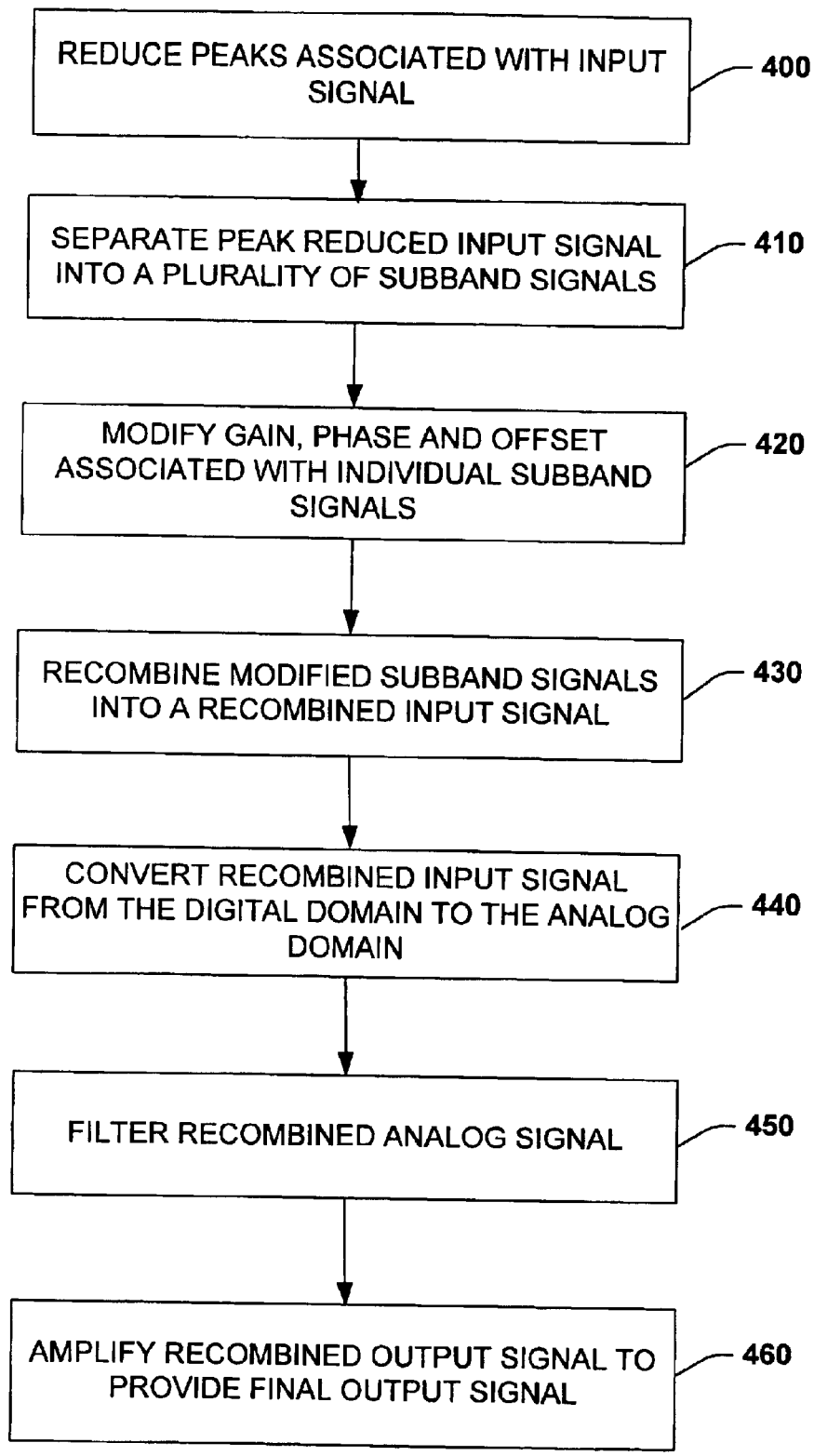
FIG. 10 illustrates another methodology for amplifying an input signal in accordance with an aspect of the present invention.

In view of the foregoing structural and functional features described above, methodologies in accordance with various aspects of the present invention will be better appreciated with reference to FIGS. 9–10. While, for purposes of simplicity of explanation, the methodologies of FIGS. 9–10 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 9 illustrates a methodology for amplifying an input signal in accordance with an aspect of the present invention. The methodology begins at 300 where peaks associated with an input signal are reduced. The peaks associated with the input signal can be reduced by clipping the input signal via soft clipping and/or hard clipping employing a clipping filter or the like. The peaks associated with the input signal can also be reduced by employing a fixed or shaped peak limiting algorithm. Furthermore, the peaks associated with the input signal can be reduced by adding an ant-peaking signal to the input signal. One or more of the above peak reducing techniques can be employed alone or in combination to reduced peaks associated with the input signal. The input signal can be an input signal that conforms to a variety of different wireless formats (e.g., WCDMA, OFDM, multi-carrier versions of GSM, CDMA 2000). The methodology then proceeds to 310.

At 310, a correction signal is generated to mitigate one or more of OOB emissions and signal distortion associated with the peak reduction of the input signal. At 320, pre-distortion is performed on the peak reduced input signal to mitigate at least a portion of one or more of the OOB emissions and signal distortion associated with the peak reduction. At 330, the peak reduced input signal and the correction signal are converted from the digital domain to the analog domain, for example, via separate associated DACs. Separating the paths of the wanted signal and correction signal allows bandwidth and dynamic range requirements to be allocated over two or more DACs. The methodology then proceeds to 340.

At 340, the analog peak reduced input signal and the analog correction signal are amplified. At 350, the analog amplified correction signal is combined with the analog amplified peak reduced input signal to mitigate or cancel OOB emissions and signal distortion caused by peak reduction of the input signal. The correction signal can be combined with the peak reduced input signal via a summer or coupler prior to final amplification. Alternatively, the correction signal can be amplified by a cancellation amplifier and combined with the peak reduced input signal via a summer or coupler after amplification of the peak reduced input signal by a power amplifier. At 360, the amplified combined output signal substantially free of one or more of OOB emissions and signal distortion is filtered to remove any remaining unwanted signals outside the desired transmission band. The final output signal is transmitted over a wireless connection at 370.

FIG. 10 illustrates another methodology for amplifying an input signal in accordance with an aspect of the present invention. The methodology begins at 400 where peaks associated with an input signal are reduced. The peaks associated with the input signal can be reduced by clipping the input signal via soft clipping and/or hard clipping, by employing a fixed or shaped peak limiting algorithm, and/or adding an ant-peaking signal to the input signal. The input signal can be an input signal that conforms to a variety of different wireless formats (e.g., WCDMA, OFDM, multi-carrier versions of GSM, CDMA 2000). The methodology then proceeds to 410. At 410, one or more of the peak reduced input signal, the adjacent spectral channels, and nearby spectral bands are separated into a plurality of sub-band signals. At 420, associated sub-band signals are modified, for example, by adjusting the gain, phase and/or offset (all as a function of time or input signal) associated with the individual sub-band signals. The signal modifications are computed to cancel one or more of the OOB emissions and signal distortion that will be present after final amplification. The optional offset term to the conventional gain and phase modifications, optimizes corrections for each portion of the spectrum. The methodology then proceeds to 430.

At 430, the modified sub-band signals are converted from the digital domain to the analog domain. At 440, the modified analog sub-band signals are aggregated or recombined to provide a recombined analog input signal. The aggregation may occur prior to conversion to the analog domain. The aggregated signal will have mitigated OOB emissions due to clipping and may contain additional linearization terms. At 450, the aggregated analog input signal is optionally filtered by an acoustic wave (SAW) filter or the like. At 460, the aggregated analog input signal is then amplified to provide a final amplified output signal for transmission over a wireless link. One or more additional signals can be added to the aggregated signal prior to amplification or after amplification to mitigate any remaining signal distortion and OOB emissions. The amplified signal is passed through an optional bandpass filter to remove signals outside of the transmission band at 470.

What has been described above includes exemplary implementations of the preserit invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplification system comprising:
   a peak reduction component that reduces peaks associated with an input signal to provide a peak reduced input signal;
   a correction signal generator that generates a correction signal that corresponds to corrections of the peak reduced input signal;
   a power amplifier that amplifies the peak reduced input signal to provide an amplified peak reduced output signal; and
   a summer that sums one of the peak reduced input signal and the amplified peak reduced output signal with the correction signal to provide a final amplified output signal substantially free of at least one of the signal distortion and out-of-band (OOB) emissions.

2. The system of claim 1, the peak reduction component being a clipping filter.

3. The system of claim 1, further comprising a pre-distortion component that removes at least a portion of at least one of the signal distortion and OOB emissions from the peak reduced input signal.

4. The system of claim 1, further comprising a first digital-to-analog converter (DAC) that converts the peak reduced input signal from the digital domain to the analog domain to provide an analog peak reduced input signal to the power amplifier, and a second DAC that converts the correction signal from the digital domain to the analog domain to provide an analog correction signal.

5. The system of claim 4, at least one of the first and second DACs being delta-sigma DACs, such that the at least one of the input signal and the correction signal are converted into the analog domain directly at a desired radio transmission frequency.

6. The system of claim 1, the peak reduction component adding an anti-peak signal to the input signal to provide the peak reduced input signal and the correction signal removing the anti-peak signal prior to final transmission.

7. The system of claim 1, further comprising a cancellation amplifier associated with amplification of the correction signal.

8. The system of claim 1, further comprising:
   a channelizer that separates one of a wanted signal and a peak reduced input signal into a plurality of sub-bands;
   a plurality of modification components that modify at least one of gain, phase and offset associated with a corresponding sub-band of the plurality of sub-bands to mitigate at least one of the distortion and OOB emissions associated with the sub-band; and
   an aggregator that recombines the plurality of sub-bands into an aggregated signal which is provide to the power amplifier.

9. The system of claim 1, the amplification system being one of linear amplifier system, an envelope elimination and restoration (EER) amplifier, a Linear Amplification with Nonlinear Components (LINC) amplifier, an envelope tracking amplifier and a Doherty amplifier.

10. A transmitter comprising the amplification system of claim 1.

11. A base station comprising the transmitter of claim 10.

12. An amplification system comprising:
    means for reducing peaks associated with a digital input signal to provide a peak reduced input signal;
    means for generating a digital correction signal associated with peak reduction of the input signal;
    means for converting the peak reduced input signal from the digital domain to the analog domain;
    means for converting the correction signal from the digital domain to the analog domain;
    means for amplifying the peak reduced input signal to provide a peak reduced output signal; and
    means for combining the correction signal with one of the peak reduced input signal and the peak reduced output signal to provide a final output signal substantially free of at least one of out-of-band (OOB) emissions and signal distortion.

13. The system of claim 12, the means for reducing peaks associated with a digital input signal to provide a peak reduced input signal comprising means for clipping the input signal.

14. The system of claim 12, the means for reducing peaks associated with a digital input signal comprising means for adding an anti-peak signal to the input signal.

15. The system of claim 12, further comprising:
    means for separating at least one of the input signal, adjacent spectral channels, and nearby spectral bands into a plurality of sub-bands;
    means for modifying at least one of gain, phase and offset of at least one of the plurality of sub-bands; and
    means for aggregating the plurality of sub-bands into an aggregated signal.

16. A method of amplifying an input signal comprising:
    removing peaks associated with an input signal to provide a peak reduced input signal;
    generating a correction signal associated with peak reduction of the input signal;
    amplifying the peak reduced input signal to provide a peak reduced amplified output signal; and
    combining the correction signal with one of the peak reduced input signal and the peak reduced amplified output signal to provide a final output signal substantially free of out-of-band (OOB) emissions and signal distortion.

17. The method of claim 16, further comprising converting the peak reduced input signal and the correction signal from the digital domain to the analog domain.

18. The method of claim 16, the removing peaks associated with an input signal to provide a peak reduced input signal comprising one of clipping the input signal and adding an anti-peak signal to the input signal.

19. The method of claim 16, further comprising predistorting the peak reduced input signal to mitigate at least a portion of the signal distortion and OOB emissions.

* * * * *